(12) United States Patent
Juso et al.

(10) Patent No.: US 6,181,002 B1
(45) Date of Patent: Jan. 30, 2001

(54) SEMICONDUCTOR DEVICE HAVING A PLURALITY OF SEMICONDUCTOR CHIPS

(75) Inventors: Hiroyuki Juso, Gose; Yoshiki Sota, Nara; Tomoyo Maruyama, Kitakatsuragi-gun, all of (JP)

(73) Assignee: Sharp Kabushiki Kaisha (JP)

( * ) Notice: Under 35 U.S.C. 154(b), the term of this patent shall be extended for 0 days.

(21) Appl. No.: 09/460,245

(22) Filed: Dec. 13, 1999

(30) Foreign Application Priority Data

Dec. 22, 1998 (JP) .................................................. 10-364155

(51) Int. Cl.⁷ ...................................................... H01L 23/02
(52) U.S. Cl. .......................... 257/686; 257/778; 257/777; 257/723; 257/784; 257/738
(58) Field of Search .................................. 257/686, 777, 257/778, 723, 784

(56) References Cited

U.S. PATENT DOCUMENTS 5,773,896 * 6/1998 Fugimoto et al. .................... 257/777
5,804,004 * 9/1998 Tuckerman et al. .................... 156/60
5,861,666 * 1/1999 Bellaar ................. 257/686
5,953,588 * 9/1999 Camien et al. ........................ 438/106

FOREIGN PATENT DOCUMENTS

0782191A2 * 7/1997 (EP) ........................................ 25/65
9-186289 * 7/1997 (JP) ............................................ 25/8

* cited by examiner

Primary Examiner—Tom Thomas
Assistant Examiner—Nitin Parekh
(74) Attorney, Agent, or Firm—Nixon & Vanderhye PC

(57) ABSTRACT

A semiconductor device includes an insulative substrate having a layer of interconnection patterns formed on a chip-side surface and external terminals formed on the opposite surface, and a plurality of semiconductor chips stacked on the chip-side surface of the insulative substrate. In the semiconductor device, among the plurality of semiconductor chips, a semiconductor chip having the largest plan surface area has the greatest thickness.

15 Claims, 6 Drawing Sheets

SEMICONDUCTOR DEVICE HAVING A PLURALITY OF SEMICONDUCTOR CHIPS

CROSS-REFERENCES TO RELATED APPLICATIONS

This application Is related to Japanese patent application No. HEI 10(1998)-364155 filed on Dec. 22, 1998 whose priority is claimed under 35 USC §119, the disclosure of which is incorporated herein by reference in its entirety.

BACKGROUND OF THE INVENTION

1. Field of the Invention

The present invention relates to a semiconductor device and, more particularly, to a resin overmolded type semiconductor device having a plurality of semiconductor chips arranged therein in a stacked relation for higher density integration.

2. Description of the Related Art

For enhancement of the capacities and additional values of memories for portable systems and the like, semiconductor devices have been provided which include a plurality of semiconductor chips mounted in a single package. One example of such semiconductor devices is a multi-chip module in which a plurality of semiconductor chips are arranged in juxtaposition. However, the juxtaposition of the semiconductor chips makes it impossible to fabricate a package having a smaller plan surface area than the total plan surface area of the mounted semiconductor chips.

Another example of the aforesaid semiconductor devices includes a package in which a plurality of semiconductor chips are arranged in a stacked relation for higher density integration (hereinafter referred to as "stacked package").

One exemplary stacked package is a chip size package (hereinafter referred to as "CSP") having such a construction that semiconductor chips are stacked on an electrically insulative substrate which has external connection terminals arranged in a matrix array on its back surface.

FIG. 5 is a sectional view illustrating a semiconductor device of the CSP structure. Where the semiconductor device shown in FIG. 5 includes semiconductor chips of different plan surface areas arranged therein in a stacked relation, the outer size of a package of the semiconductor device depends on the size of a semiconductor chip having the largest plan surface area. In the case of the conventional semiconductor device, no consideration is given to the thicknesses of the respective semiconductor chips, that is, the semiconductor chips typically have the same thickness. Since the stacked package contains therein a chip having a smaller plan surface area unlike a single chip package of the CSP structure as shown in FIG. 6, the semiconductor chips occupy a smaller proportion of the volume of the stacked package than a molded resin portion.

The aforesaid semiconductor device has a small size with its external connection terminals being arranged in an area array. The semiconductor device having such a construction is mounted on a printed board by are flow process. The package of the semiconductor device may be of a BGA (ball grid array) structure with the external terminals being formedas solder balls, or of aLGA (landgridarray) structure with the external terminals being formed of a solder paste as trapezoidal lands.

If a temperature change occurs in the semiconductor device and the printed board due to a heat cycle or the like after the reflow process for the mounting, the semiconductor device may warp, and stresses may occur in junctures between the semiconductor device and the printed board due to a difference in the coefficient of linear expansion therebetween.

In the aforesaid semiconductor device, only one side of the semiconductor chip is sealed with a mold resin. Therefore, the temperature change causes the semiconductor device to warp as shown in FIG. 7 due to a so-called bimetal phenomenon occurring between the semiconductor chip and the mold resin portion. The warpage of the semiconductor device causes stresses in the junctures between the semiconductor device and the printed board, resulting in cracking and breakage of the junctures.

SUMMARY OF THE INVENTION

In accordance with the present invention, there is provided a semiconductor device which comprises: an insulative substrate having a layer of interconnection patterns formedonachip-side surface thereof, and external terminals formed on a surface thereof opposite from the chip-side surface; and a plurality of semiconductor chips stacked on the chip-side surface of the insulative substrate and electrically connected to the corresponding interconnection patterns; wherein, among the plurality of semiconductor chips, a semiconductor chip having the largest plan surface area has the greatest thickness.

In the semiconductor device, another layer of interconnection patterns is provided on the surface of the insulative substrate opposite from the chip-side surface.

DETAILED DESCRIPTION OF THE PREFERRED EMBODIMENTS

The present invention will hereinafter be described in detail by way of embodiments thereof.

Figure 1:
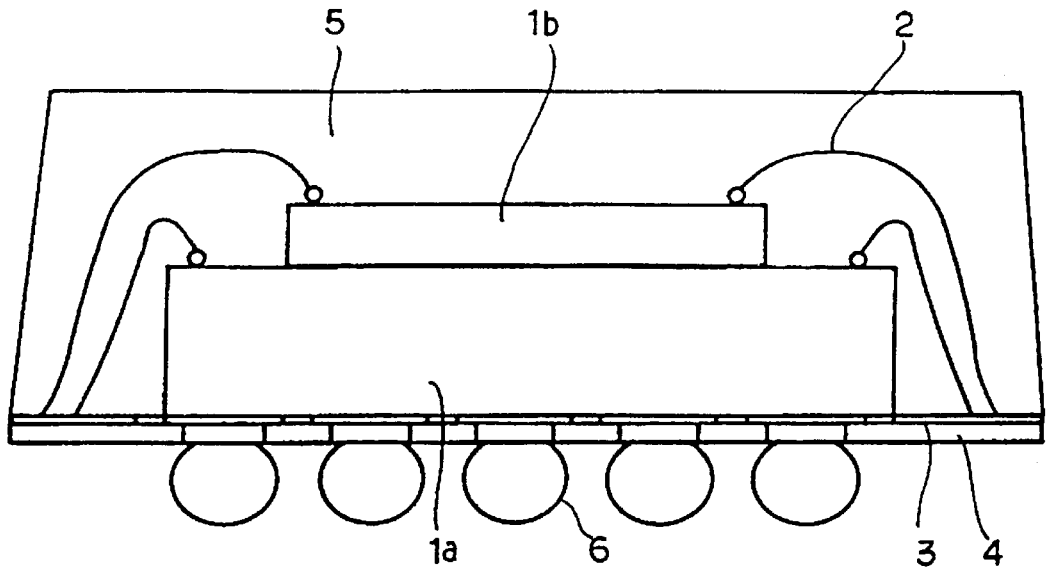
FIG. 1 is a sectional view illustrating a semiconductor device according to a first embodiment of the present invention.

FIG. 1 is a sectional view illustrating a semiconductor device according to a first embodiment of the present invention. The semiconductor device includes: an insulative substrate 4 having a layer of interconnection patterns 3 formed on a chip-side surface thereof, and external connection terminals 6 arranged in an area array on a surface thereof opposite from the chip-side surface; semiconductor chips 1a and 1b mounted on the chip-side surface of the insulative substrate 4 and electrically connected to the corresponding interconnection patterns 3 on the substrate by wires 2; and a resin sealer 5 sealing therein the semiconductor chips 1a and 1b and the wires 2. The sealing of the semiconductor chips 1a and 1b and wires 2 in the resin sealer 5 is achieved by a transfer molding method. The external connection terminals are formed as solder balls which extend through through-holes formed in the insulative substrate 4 for connection to the interconnection patterns. The semiconductor chip 1a has a larger plan surface area and a greater thickness than the semiconductor chip 1b.

A feature of the present invention is that, of the plurality of semiconductor chips 1a and 1b mounted on the insulative substrate 4, the semiconductor chip 1a having a larger plan surface area has a greater thickness than the semiconductor chip 1b. The thickness of the semiconductor chip is reduced by mechanical polishing or chemical etching of a wafer before dicing.

Figure 7:
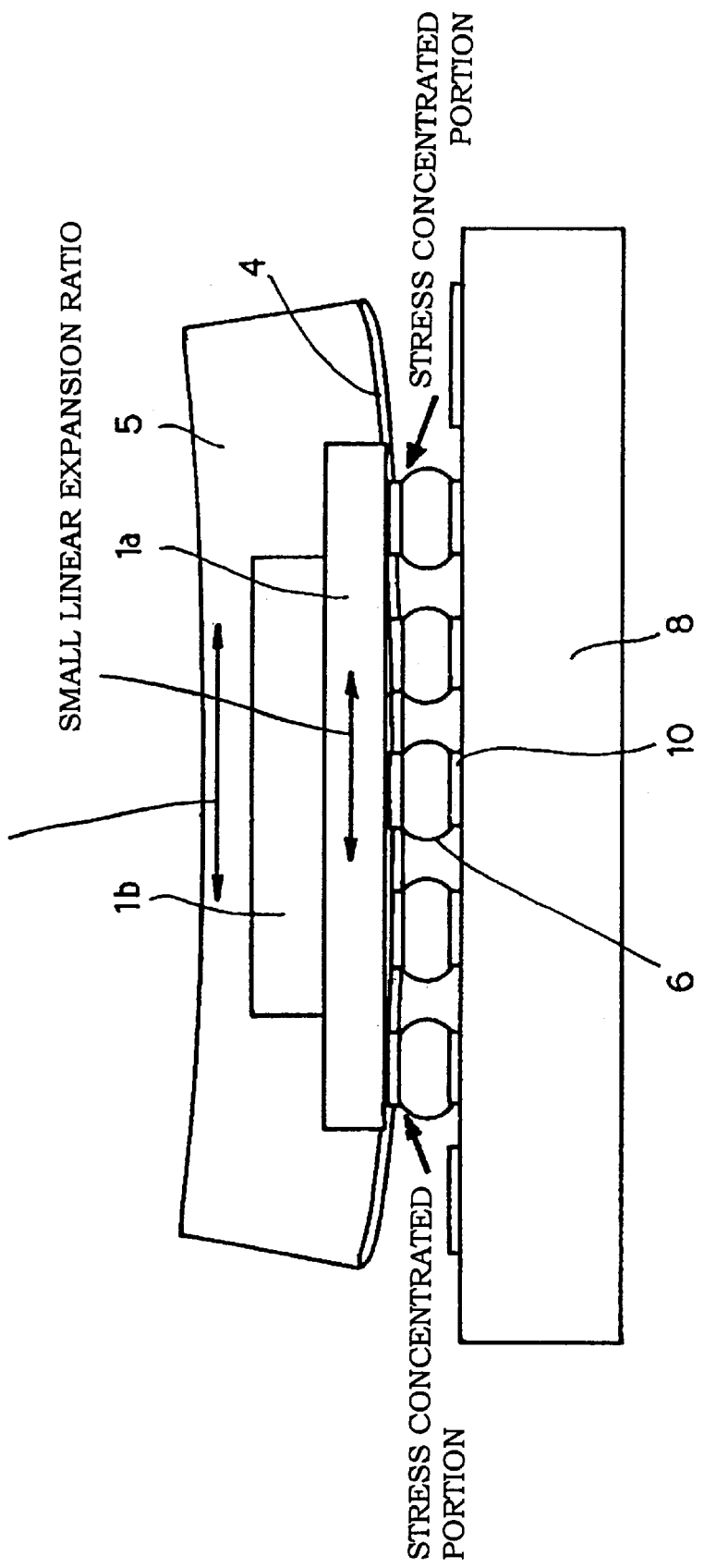
FIG. 7 is a diagram for explaining a mechanism for warpage of a semiconductor device.
Figure 9:
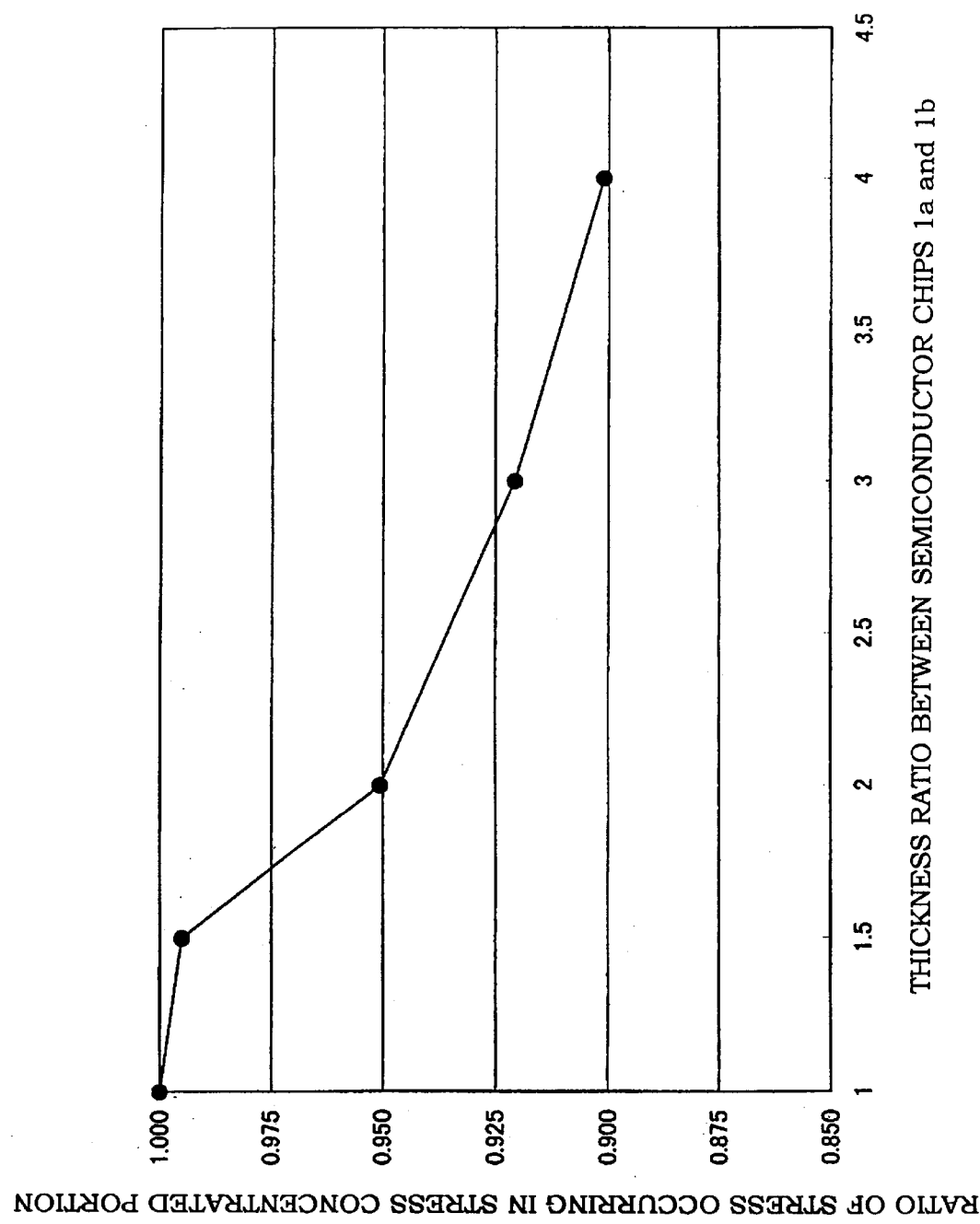
FIG. 9 is a diagram illustrating a relationship between the thickness ratio of semiconductor chips and the ratio of a stress occurring in a stress concentrated portion.

For simulation of occurrence of stresses in junctures between the semiconductor device and a printed board (see FIG. 7), a temperature cycling test was performed after the semiconductor device was mounted on the printed board through a reflow process. Employed as the semiconductor device for the simulation were a semiconductor device which included semiconductor chips 1a and 1b having thicknesses of 300 ím and 100 ím, respectively, and a resin sealer having a thickness of 800 ím in accordance with this embodiment and a semiconductor device which included semiconductor chips 1a and 1b each having a thickness of 200 ím. The semiconductor devices each had a package length of 11.00 mm and lengths of the semiconductor chips 1a and 1b of 9.00 mm and 4.82 mm, respectively, as measured unidimensionally, and 12 solder balls were arranged at a pitch of 0.8 mm on the back side thereof. For the simulation, a temperature difference of 135° C. was given between the semiconductor device and the printed board. As shown in FIG. 9, it was confirmed through the simulation that stresses occurring in stress concentrated portions located between the printed board and the semiconductor device with the thickness ratio between the semiconductor chips 1a and 1b being 3:1 was about 92% of that observed in the case where the thickness ratio was 1:1. Thus, the semiconductor device of the present invention was proved to provide a higher reliability after the semiconductor device was mounted on the printed board through t he reflow process.

As shown in FIG. 9, if the thickness ratio of the thick semiconductor chip 1a to the thin semiconductor chip 1b is not smaller than two, the stresses occurring in the stress concentrated portions can effectively be reduced. The thickness ratio is preferably not smaller than three, more preferably not smaller than four. If the thickness ratio is not smaller than four, the plurality of stacked semiconductor chips are considered to be equivalent to a single semiconductor chip, so that the stress can be reduced to a stress level from which a single chip package would suffer.

As described above, the plurality of semiconductor chips are arranged in a stacked relation in the semiconductor device, but the number of the semiconductor chips is not particularly limited. The semiconductor device may be of a three- or four-chip stacked structure. For example, one or more semiconductor chips each having a smaller plan surface area and a smaller thickness may be stacked on a semiconductor chip having a larger plan surface area and a greater thickness for formation of a two- or three-chip stacked structure. Alternatively, a semiconductor chip having a smaller plan surface area and a smaller thickness may be stacked on a semiconductor chip having a larger plan surface area and a greater thickness, and a semiconductor chip having a further smaller plan surface area and a further smaller thickness may be stacked thereon for formation of a three-chip stacked structure.

Where the semiconductor device has the three-chip stacked structure, the total thickness of the thinner semiconductor chips may be greater than the thickness of the thickest semiconductor chip.

The stacking order of the semiconductor chips is not particularly limited, but the semiconductor chips may be stacked in any of various relations. The stacking order is typically such that a semiconductor chip having a smaller plan surface area and a smaller thickness is stacked on a semiconductor chip having a larger plan surface area and a greater thickness. Conversely, a semiconductor chip having a larger plan surface area and a greater thickness may be stacked on a semiconductor chip having a smaller plan surface area and a smaller thickness, and a semiconductor chip having a further smaller plan surface area and a further smaller thickness may be stacked thereon.

The size and shape of the semiconductor chips are not particularly limited. The semiconductor chips are typically rectangular, but may have any shape. The plan surface areas of the respective semiconductor chips are not particularly limited, but are preferably such that a noticeable bimetal phenomenon can be prevented from occurring between the semiconductor chips and the mold resin portion after the mounting of the semiconductor device.

The arrangement and number of the external connection terminals provided on the back side of the semiconductor device are not particularly limited.

A difference between the volume of the entire mold resin portion and the total volume of the semiconductor chips sealed therein is preferably as small as possible to reduce the proportion of the mold resin portion having a higher linear expansion coefficient.

Figure 2:
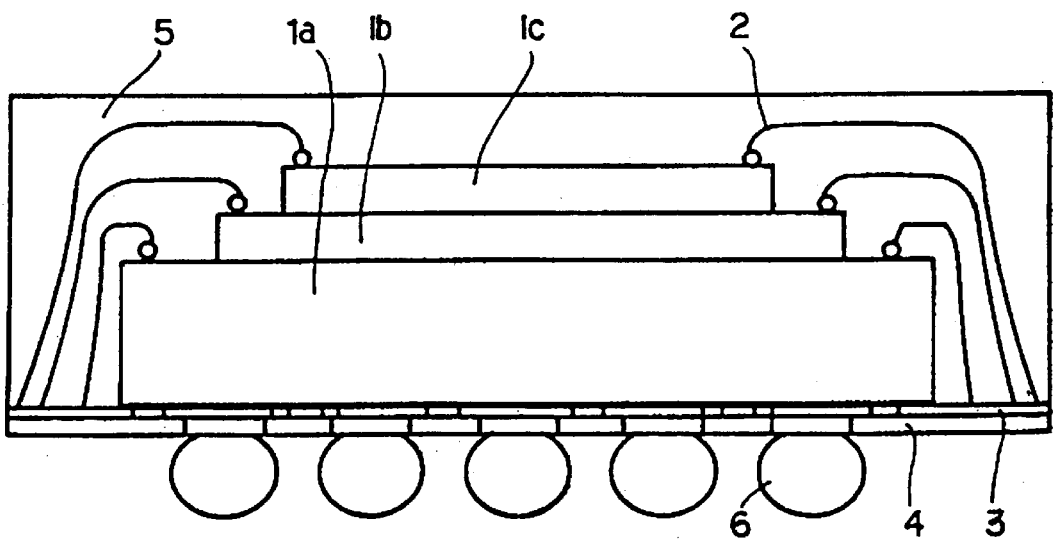
FIG. 2 is a sectional view illustrating a semiconductor device according to a second embodiment of the present invention.

With reference to FIG. 2, an explanation will be given to a semiconductor device according a second embodiment of the present invention. The semiconductor device of the second embodiment includes three semiconductor chips 1a, 1b and 1c arranged in a stacked relation.

Even if three or more semiconductor chips are stacked in the semiconductor device, the same effect as provided by the first embodiment shown in FIG. 1 can be ensured by increasing the thickness of a semiconductor chip having the largest plan surface area.

Figure 3:
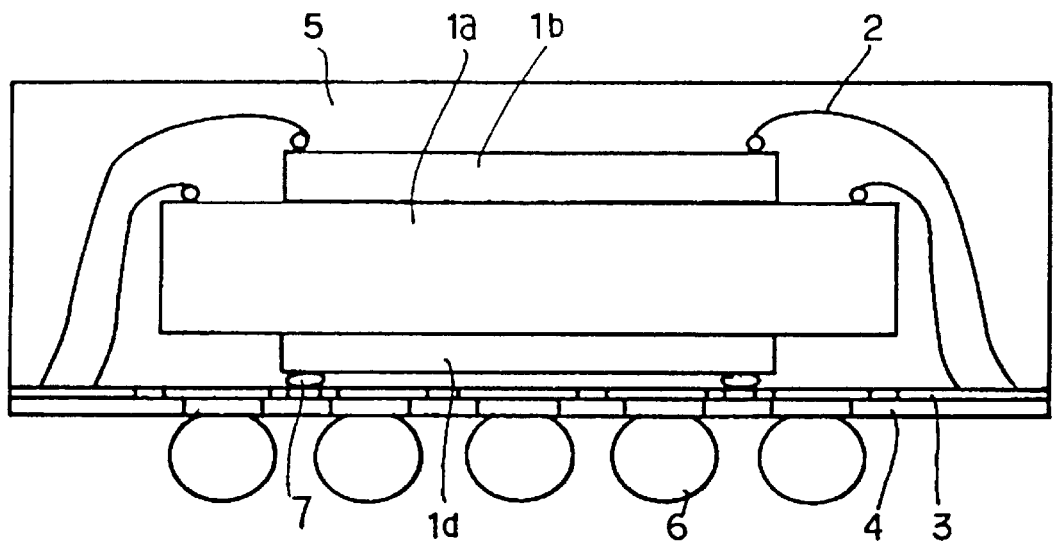
FIG. 3 is a sectional view illustrating a semiconductor device according to a third embodiment of the present invention.

FIG. 3 is a sectional view illustrating a semiconductor device according to a third embodiment of the present invention. The semiconductor device of the third embodiment includes three semiconductor chips 1a, 1b and 1d, and the lowermost semiconductor chip 1d is of flip-chip type which is connected to a layer of interconnection patterns on an insulative substrate 4.

In this embodiment, the semiconductor chip 1a having a larger plan surface area has a greater thickness than the semiconductor chips 1b and 1d. Even if the semiconductor chip 1a having the largest plan surface area is not located at the lowermost position, the same effect as provided by the foregoing embodiments can be ensured by increasing the thickness of the semiconductor chip 1a having the largest plan surface area.

Figure 4:
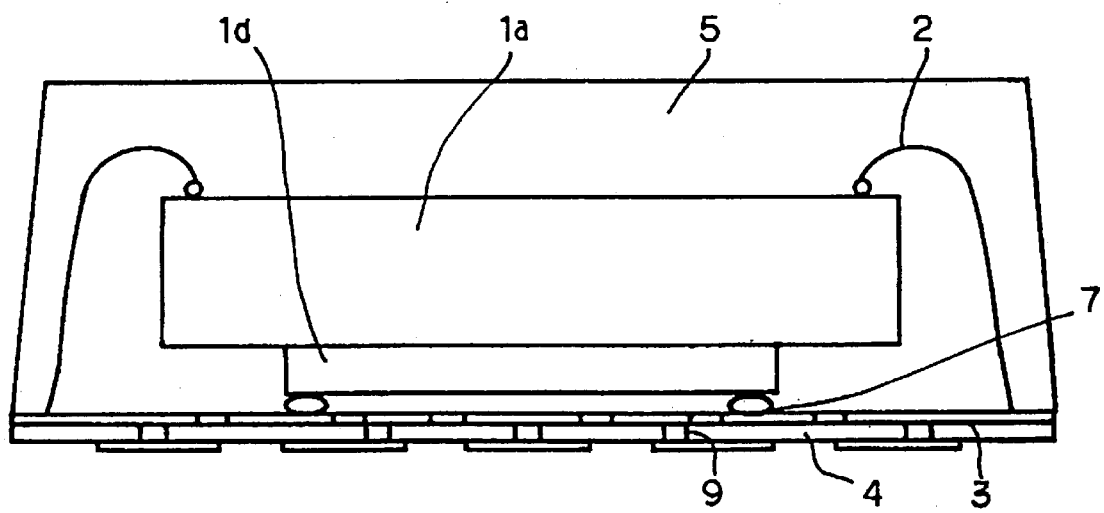
FIG. 4 is a sectional view illustrating a semiconductor device according to a fourth embodiment of the present invention.
Figure 5:
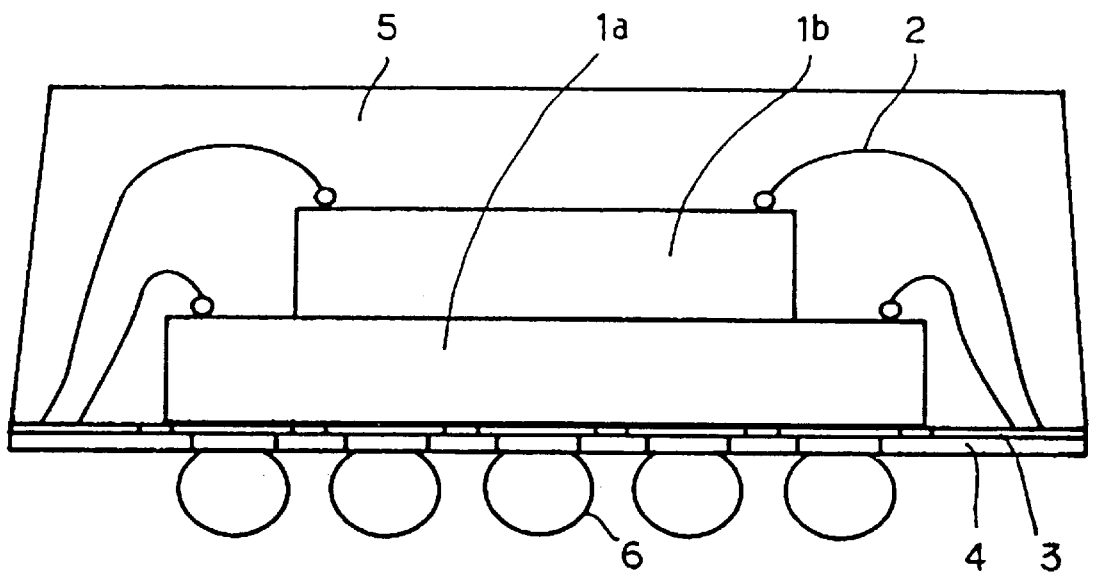
FIG. 5 is a sectional view illustrating a semiconductor device according to a first prior art.
Figure 6:
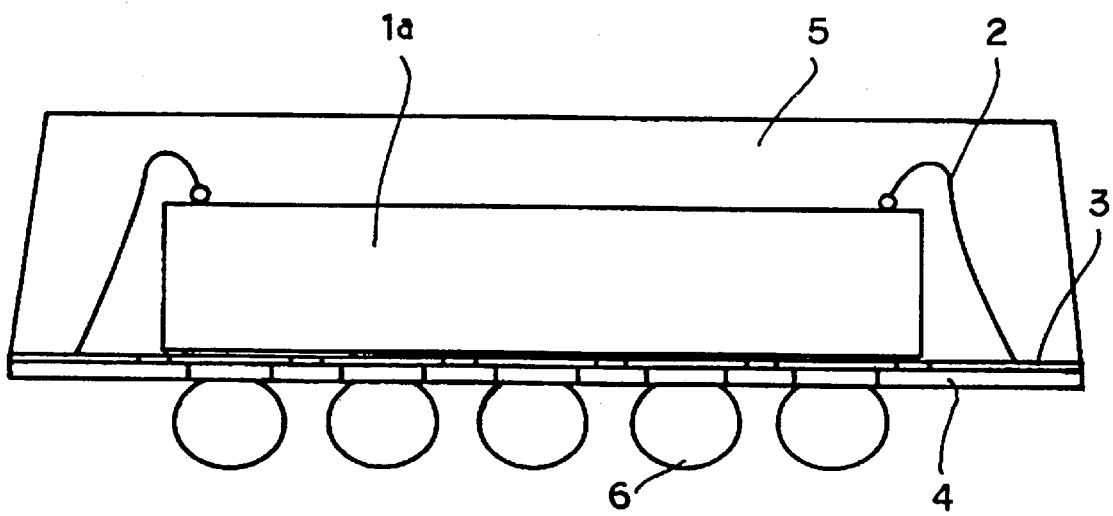
FIG. 6 is a sectional view illustrating a semiconductor device according to a second prior art.
Figure 8:
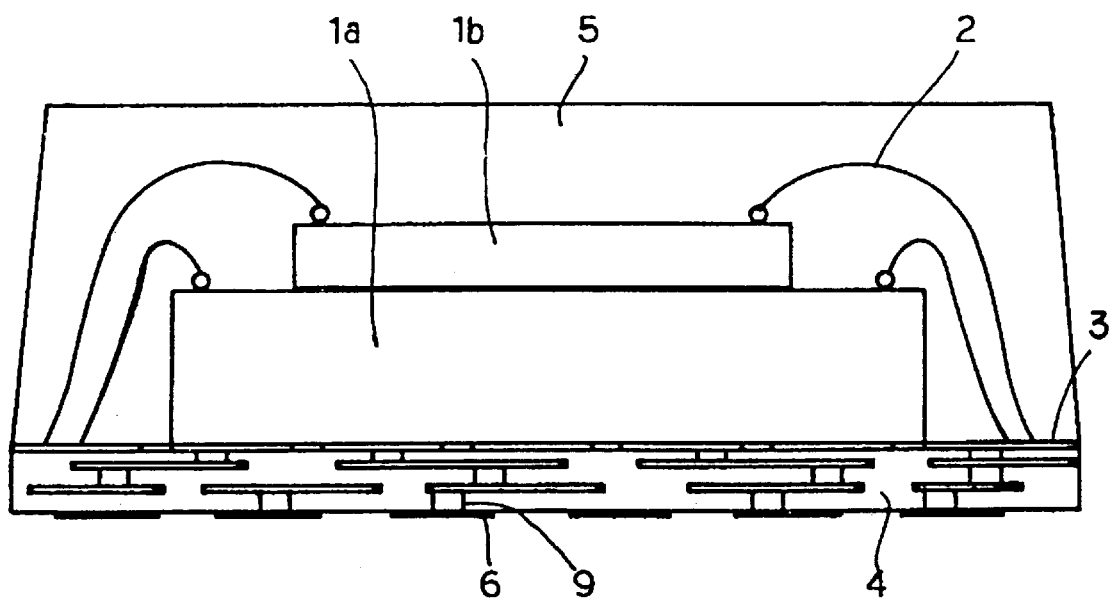
FIG. 8 is a sectional view illustrating a semiconductor device employing a multi-layer interconnection board in accordance with another embodiment of the present invention.

FIG. 4 is a sectional view illustrating a semiconductor device according to a fourth embodiment of the present invention. The semiconductor device of the fourth embodiment is of the LGA structure, which includes a double-sided interconnection board having layers of interconnection patterns formed on opposite surfaces of an insulative substrate with a semiconductor chip 1d of flip-chip type being directly connected to the interconnection board. The interconnection patterns on an upper side of the double-sided interconnection board are connected to the interconnection patterns on a lower side of the board through through-holes. FIG. 8 is a sectional view illustrating a semiconductor device which includes an insulative substrate formed with multiple layers of interconnection patterns. In either of the semiconductor devices shown in FIGS. 4 and 8, a semiconductor chip having a larger plan surface area has a greater thickness. With this arrangement, the semiconductor chips occupy a greater proportion of the volume of the semiconductor device than the mold resin portion, so that the stresses exerted on the semiconductor device can be reduced.

In the present invention, the material for the insulative substrate, the method for the electrical connection between the semiconductor chips and the interconnection patterns on the insulative substrate, the method for the die-bonding of the semiconductor chips to the insulative substrate and the shape of the external connection terminals are not particularly limited. The insulative substrate may be a resin substrate or film having an excellent heat resistance, and the material therefor is not particularly limited. Exemplary materials for the insulative substrate include a polyimide, a glass epoxy, a BT (bismaleimide triazine) resin, apolyester, apolyamide, a polyethylene fluoride, a ceramic and a glass polyester. The insulative substrate may be formed with a single layer or multiple layers of interconnection patterns. For example, a one-sided interconnection board having a single layer of interconnection patterns formed on one side thereof and connected to the external connection terminals through through-holes formed therein, a double-sided interconnection board having two layers of interconnection patterns respectively formed on opposite sides thereof and connected to each other through through-holes formed therein, or a multi-layer interconnection board having multiple layers of interconnection patterns as shown in FIG. 8 may be used. The method for connecting the semiconductor chips to the interconnection patterns on the insulative substrate is not particularly limited. The connection between the lowermost semiconductor chip and the interconnection patterns on the insulative substrate may be achieved by a face-down flip-chip connection method or by a face-up wire bonding method.

The second lowermost or upper semiconductor chip may be connected to the interconnection patterns on the insulative substrate by the wire bonding method or connected to interconnection patterns formed on a semiconductor chip located therebelow by the flip-chip connection method or the wire bonding method. The external connection terminals may be arranged in the BGA which employs solder balls or in the LGA on the multi-layer interconnection insulative substrate.

As described above, the present invention provides a semiconductor device of a chip size package which ensures an improved reliability after mounting thereof, compared with the conventional semiconductor devices.

Further, the present invention allows for more flexible interconnection layout.

What is claimed is:

1. A semiconductor device which comprises:
   an insulative substrate having a layer of interconnection patterns formed on a chip-side surface thereof and external terminals formed on a surface thereof opposite from the chip-side surface; and
   a plurality of semiconductor chips stacked on the chip-side surface of the insulative substrate and each electrically connected to corresponding interconnection patterns;
   wherein, among the plurality of semiconductor chips, a semiconductor chip having the largest plan surface area has the greatest thickness.

2. A semiconductor device according to claim 1 wherein another layer of Interconnection patterns is provided on the surface of the insulative substrate opposite from the chip-side surface.

3. A semiconductor device according to claim 1 wherein the plurality of semiconductor chips comprise a first semiconductor chip having a certain thickness and a second semiconductor chip having a smaller plan surface area and a smaller thickness than the first semiconductor chip, the first semiconductor chip being located at a lower position and the second semiconductor chip at an upper position.

4. A semiconductor device according to claim 1 wherein the plurality of semiconductor chips comprise a first semiconductor chip having a certain thickness, a second semiconductor chip having a smaller plan surface area and a smaller thickness than the first semiconductor chip and a third semiconductor chip having a plan surface area smaller than and a thickness equal to or smaller than the second semiconductor chip, the first semiconductor chip being located at a lower position, the second semiconductor chip at a midst position and the third semiconductor chip at an upper position.

5. A semiconductor device according to claim 1 wherein the plurality of semiconductor chips comprise a first semiconductor chip having a certain thickness, a second semiconductor chip having a smaller plan surface area and a smaller thickness than the first semiconductor chip and a third semiconductor chip having a plan surface area equal to and a thickness equal to or smaller than the second semiconductor chip, the third semiconductor chip being located at a lower position, the first semiconductor chip at a midst position and the second semiconductor chip at an upper position, the third semiconductor chip being connected to an interconnection pattern on the insulative substrate by a flip-chip connection method.

6. A semiconductor device according to claim 1 wherein the plurality of semiconductor chips comprise a first semiconductor chip having a certain thickness, a second semiconductor chip having a smaller plan surface area and a smaller thickness than the first semiconductor chip, the second semiconductor chip being located at a lower position and the first semiconductor chip at an upper position, the second semiconductor chip being connected to an interconnection pattern on the insulative substrate by a flip-chip type connection method.

7. A semiconductor device which comprises:
   an insulative substrate having a layer of interconnection patterns formed on a chip-side surface thereof and external terminals formed on a surface thereof opposite from the chip-side surface; and
   a plurality of semiconductor chips stacked on the chip-side surface of the insulative substrate and each electrically connected to corresponding interconnection patterns;

wherein, a first of said semiconductor chips has a plan surface area larger than a plan surface area of a second of said plurality of semiconductor chips, said first semiconductor chip having a thickness greater than said second semiconductor chip.

8. A semiconductor device according to claim 7, wherein another layer of interconnection patterns is provided on the surface of the insulative substrate opposite from the chip-side surface.

9. A semiconductor device according to claim 7, wherein said first semiconductor chip is located closer to said chip-side surface than said second semiconductor chip.

10. A semiconductor device according to claim 7, wherein the plurality of semiconductor chips further comprises a third semiconductor chip having a plan surface area smaller than and a thickness equal to or smaller than the second semiconductor chip, the first semiconductor chip being located at a lower position, closer to said chip-side surface than said second and third semiconductor chips, the second semiconductor chip being located at a middle position and the third semiconductor chip being located at an upper position.

11. A semiconductor device according to claim 7, wherein the plurality of semiconductor chips further comprises a third semiconductor chip having a plan surface area equal to and a thickness equal to or smaller than the second semiconductor chip, the third semiconductor chip being located at a lower position, closest to said chip-side surface, the first semiconductor chip being located at a midst position and the second semiconductor chip being located at an upper position, the third semiconductor chip being connected to an interconnection pattern on the insulative substrate by a flip-chip connection method.

12. A semiconductor device according to claim 7, wherein the second semiconductor chip is located at a lower position, closer to said chip-side surface, and the first semiconductor chip is located at an upper position, the second semiconductor chip being connected to an interconnection pattern on the insulative substrate by a flip-chip type connection method.

13. A semiconductor device according to claim 7, wherein a thickness ratio of said thicker, first semiconductor chip to said second semiconductor chip is at least 2.

14. A semiconductor device according to claim 7, wherein the thickness ratio of the thicker, first semiconductor chip to the second semiconductor chip is at least 3.

15. A semiconductor device according to claim 7, wherein the thickness ratio of the thicker, first semiconductor chip to the second semiconductor chip is at least 4.

* * * * *